(12) United States Patent
Arnold et al.

(10) Patent No.: US 6,456,092 B1
(45) Date of Patent: Sep. 24, 2002

(54) NETWORK VECTOR CHANNEL ANALYZER

(75) Inventors: Andreas Arnold, Karlsruhe; Oliver Braz, Lonsee; Hans Kunkel, Karlsruhe; Manfred Thumm, Linkenheim-Hochsietten, all of (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 40 days.

(21) Appl. No.: 09/698,876

(22) Filed: Oct. 27, 2000

Related U.S. Application Data

(63) Continuation-in-part of application No. PCT/EP99/01622, filed on Mar. 12, 1999.

(30) Foreign Application Priority Data

Mar. 23, 1998 (DE) .......................................... 198 12 604

(51) Int. Cl.$^7$ .......................... G01R 27/32; H01J 25/34; H04B 15/00
(52) U.S. Cl. .......................... 324/639; 315/3.5; 455/315
(58) Field of Search ................................ 324/639, 638, 324/642, 77.11; 315/3.5; 455/315

(56) References Cited

U.S. PATENT DOCUMENTS 5,119,035 A    6/1992  Goy et al.
5,263,193 A  * 11/1993  Lammers et al. ........... 455/315
H1692 H      * 11/1997  Lohrman .................... 315/3.5

FOREIGN PATENT DOCUMENTS

GB          2 197 143         5/1988

* cited by examiner

Primary Examiner—N. Le
Assistant Examiner—James Kerveros
(74) Attorney, Agent, or Firm—Klaus J. Bach

(57) ABSTRACT

In a vector network analyzer with a transmitting and, a receiving side, each including a downward mixing super heterodyne receiver, a high voltage power supply for providing an accelerating voltage is arranged in series with a second power supply with a controllable lower output voltage so that unavoidable voltage variations in the acceleration voltage can be controlled. The second power supply is connected to the output of a phase and frequency discriminator by way of an amplifier and a low-pass filter. The discriminator has two inputs, one receiving the downwardly mixed transmitting side signal and the other the signal provided by a reference oscillator having a constant frequency. As millimeter wave oscillator a backward wave oscillator is used whose frequency drifting by temperature changes or by aging is compensated for by a control signal for the second power supply, which control signal is derived from the phase and frequency discriminator.

10 Claims, 3 Drawing Sheets

Phase-stabilized Backward wave tube | Vector volt meter circuit with triple super-bit receiver | Frequency plan

NETWORK VECTOR CHANNEL ANALYZER This is a CIP application of international application PCT/EP99/01622 filed Mar. 12, 1999 and claiming the priority of German application 198 12 604.2 filed Mar. 23, 1998.

BACKGROUND OF THE INVENTION

The invention relates to a network vector analyzer for the millimeter range. Such an analyzer comprises a millimeter wave source, a first oscillator, with a transmitting and a microwave receiving side. For obtaining measurement values, a part of the sender signal is coupled out of the wave guide to the transmitting antenna and is converted down to provide a measurement signal for a vector voltage meter. The signals are high-frequency output signals in the mm wave length range which are converted down in a phase-and-amplitude stabilized manner to frequencies suitable for further processing. The local oscillations are removed from the reference oscillator during down conversion.

The main problem in the network analysis in the millimeter wave area is a suitable millimeter wave source. With the use of a narrow band heterodyne receiver, it is possible to determine signals up to several dB of the physical noise limit ($P_{noise}$=kTB, with B=1 Hz and T=273K, these are 174 dBm). Consequently, the lower detection limit depends mainly on the bandwidth of the receiver filter. The maximum power that can still be obtained with this frequency-selective filter from the source depends on the spectral power density contained in the receiver band width and the frequency stability thereof.

The basic concept is described in U.S. Pat. No. 5,119,035. The millimeter frequency generated by multiplication and the "pumping signals" required for the down mixing of the receiver signal are derived from two 8–18 GHz oscillators. In order to obtain a phase relationship between the two YIG controlled transistor oscillators, which is needed for the vector measurement, both are coupled, by way of a phase control circuit, to a reference source in a phase-rigid manner. Like in a scalar setup, the achievable measurement range is limited by the efficiency of the multipliers used. It is indicated to be 70–80 dB in the D band.

A further development of this concept relates to a Gunn-oscillator, which is phase stabilized by way of the supply voltage. This arrangement, however, has a weakness. The used semiconductor oscillators provide the output power of several 10 mW, but their electrically tunable frequency range is limited by the required mechanical resonance space. For example, with a Gunn-oscillator having a mean frequency of 144 GHz, this frequency range is only 5 GHz. Furthermore, such oscillators, which are based on indium phosphate, are commercially available with reasonable power outputs only up to 150 GHz. The use of an independent backward wave oscillator (BWO) cannot be taken into consideration because of its insufficient frequency resolution.

It is the object of the present invention to provide a network vector analyzer, which is highly dynamic in the range of 70–190 GHz with commercially available components by which a network can be examined under the effect of millimeter waves over a large measuring range or, respectively, a large wavelength range.

SUMMARY OF THE INVENTION

In a vector network analyzer with a transmitting and a receiving side, each including a super heterodyne receiver which are downward mixing, a high voltage power supply for providing an accelerating voltage is arranged in series with a second power supply with a controllable lower output voltage so that unavoidable voltage variations in the acceleration voltage can be controlled. The second power supply is connected to the output of a phase and frequency discriminator by way of an amplifier and a low-pass filter. The discriminator has two inputs, one receiving the downwardly mixed transmitting side signal and the other the signal provided by a reference oscillator having a constant frequency. As millimeter wave oscillator a backward wave oscillator is used whose frequency drifting by temperature changes or by aging is compensated by a control signal for the second power supply, which control signal is derived from the phase and frequency discriminator.

The core of the network analyzer is a phase control circuit, which connects the first millimeter wave source to a third frequency-stable reference source. In order to facilitate an accurate frequency adjustment and to obtain for the transmitting signal a clean spectrum, the oscillator should have a quality corresponding at least to that of quartz oscillators. Better oscillators such as a rubidium-time-standard may be used, if a 10 MHz signal can be obtained therefrom. If a quartz oscillator is used as a reference source, the quartz reference forms the reference signal.

The first millimeter wave source is a transit time tube, which determines the transmission bandwidth based on its parameters. Of the group of the useable transit time tubes, the backward wave oscillator (BWO) has proved to be suitable wherein the oscillation frequency is controlled by way of the acceleration voltage.

The network apparatus required herefor have a large proportion of interference voltages such as network humming and remainders of the voltage control, which directly affect the spectrum of the output signal. Even if the acceleration voltage would be free of humming, a thermal expansion of the delaying structure would lead for the first oscillator, which is in the form of a tube, to a drifting of the frequency. In order to compensate for these interferences, a small independent DC source whose amplitude can be rapidly controlled is arranged in series with the power supply unit. The control value is formed from the downwardly mixed partial signal of the transmitter signal by phase comparison with the reference signal from the reference oscillator wherein a low pass and an amplifier are disposed in between. With an appropriate adjustment of the control parameters, a spectral width of several megahertz bandwidth is controlled down to less than 100 Hz. In this way, a receiver with a small receiving bandwidth and a vector network channel analyzer with high dynamics is realized.

The reference oscillator with constant frequency times the microwave oscillator or the microwave oscillators, which form the microwave oscillator for the downward mixing or generally the steps of downward mixing. The respective downward steps in the transmitting and receiving-side super-heterodyne-receiver may be the same or different. Important is only that, at the end of the downward mixing, the frequency of the constant-frequency reference oscillator is reached.

Important for the inductive disturbances, inspite of different first intermediate frequency levels, is the spatial separation of the two superheterodyne receivers since, with the same multiple downward steps, both include further intermediate frequency steps of the same frequency. Also, with a separate development of partially identical local oscillator frequencies in both multi-step superheterodyne receivers, the occurrence of direct cross-coupling cannot be prevented. With identical intermediate frequencies, it is to be taken into consideration that the transmitting and receiving side first mixers are operated by way of an amplifier with high isolation, which is the same as a high backward attenuation. The isolation normally corresponds at least to the amplification. At the same time, these amplifiers must not have such a large bandwidth that the first intermediate frequency (in the example 640 MHz) is noticeably amplified.

In order to achieve high dynamics with, at the same time, a high sensitivity, the main amplification should be concentrated on the lowest intermediate frequency. This however would have the disadvantage that also the unavoidable inductive interference of the reference frequency would be highly amplified. This would result in a substantial limitation of the dynamics.

The advantages of a vector network channel analyzer reside in the fact that a complete electronic control can be established whereby mechanical resonators are eliminated. Frequency drifting of the backward wave tube by temperature variations and/or aging are compensated by the phase- and frequency discriminator and the control signal derived therefrom. Using fewer backward wave oscillators—in contrast to semiconductor oscillators such as Gunn diodes—the complete mm-wave range is to be covered. Already with a D-band based wave oscillator, half of the W-, the complete D- and half of the G-band is covered. The circuit concept can be utilized in principle, with all available backward wave oscillators. Since no special development of specific high frequency building components is necessary and the needs can be satisfied by commercially available components, a network channel analyzer having good properties can be made at an economical price.

An embodiment of the invention will be described below on the basis of the accompanying drawings.

DESCRIPTION OF A PREFERRED EMBODIMENT

Figure 1:
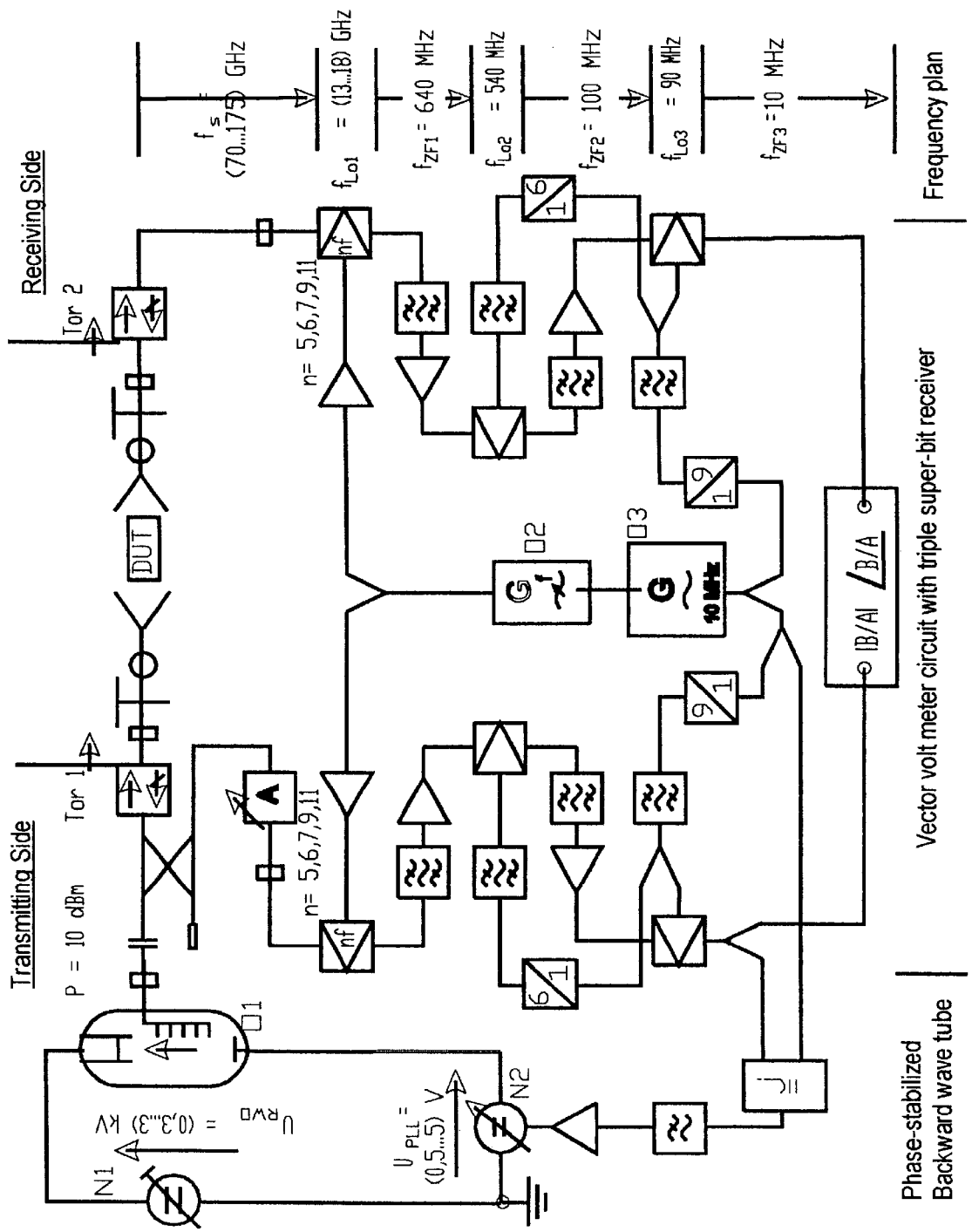
FIG. 1 shows block diagram of the vector network channel analyzer according to the invention.

The embodiment according to FIG. 1 shows, in a block diagram, the vector network channel analyzer for measuring the network to be examined (DUT=Device Under Test). With the network channel analyzer measurements can be made from 70 to 175 GHz on the basis of phase and the value or, respectively, on the basis of the value of the ratio of the transmitting and the receiving signal. Consequently, the W-, the D-band and more than half of the G-band is covered by the used backward wave oscillator (BWO). On the transmitter as well as the receiver side a triple superheterodyne receiver with identical gradation for downward mixing is installed. In this way, a narrow bandwidth with high amplification is achieved The band required for the analysis is determined in both super heterodyne-receivers to the respective harmonic n (FIG. 3) by the first millimeter wave oscillator $O_1$ and the operation of the first downward mixer. The large band width requires the widely adjustable powerful backward wave oscillator $O_1$. The coarse frequency adjustment is controlled by the acceleration voltage of $U_{RWO}$=0.3–3.0 kV between the cathode and the anode. Changes of the acceleration voltage because of the arrangement or thermal drifting of the tube $O_1$ are fine adjusted after a coarse adjustment, by way of $N_1$ by means of the independent power supply $N_2$, which is arranged in series with the power supply $N_1$. As a result, its control amplitude is at most equal to the maximum changes of the power supply $N_1$ that may be expected, that is $U_{PLL}$ =0.5–5 V.

The second power supply $N_2$ is controlled in a phase based manner by a comparison of the constant frequency 10 MHz oscillation of the quartz reference $O_3$ with the output of the down-mixed transmission signal part and then supplying it as control filter by way of the low pass and the subsequent amplifier to the control input of the small power supply. In this way, the backward wave tube $O_1$ is phase stabilized.

Figure 2B:
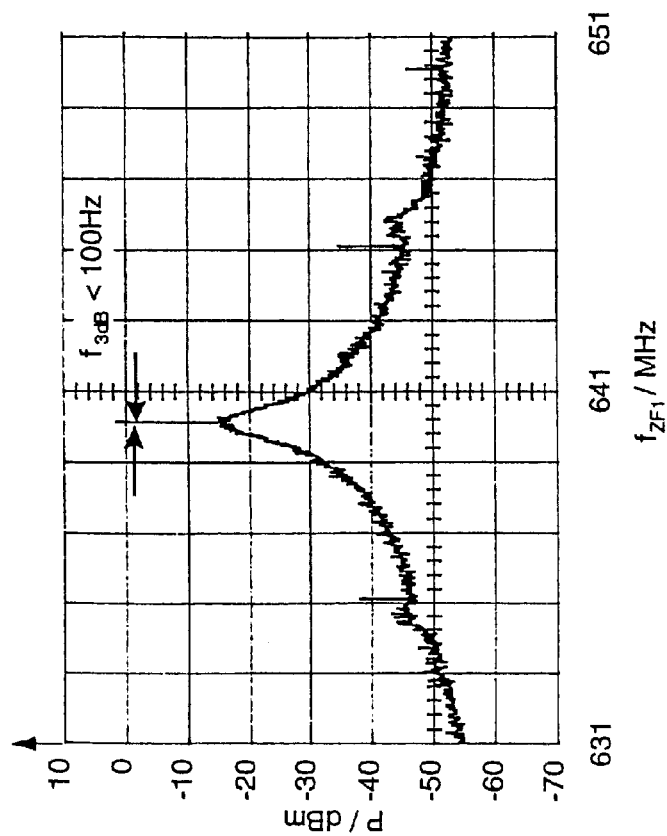
FIG. 2b shows the frequency spectrum of the phase-stabilized backward wave oscillator.
Figure 2A:
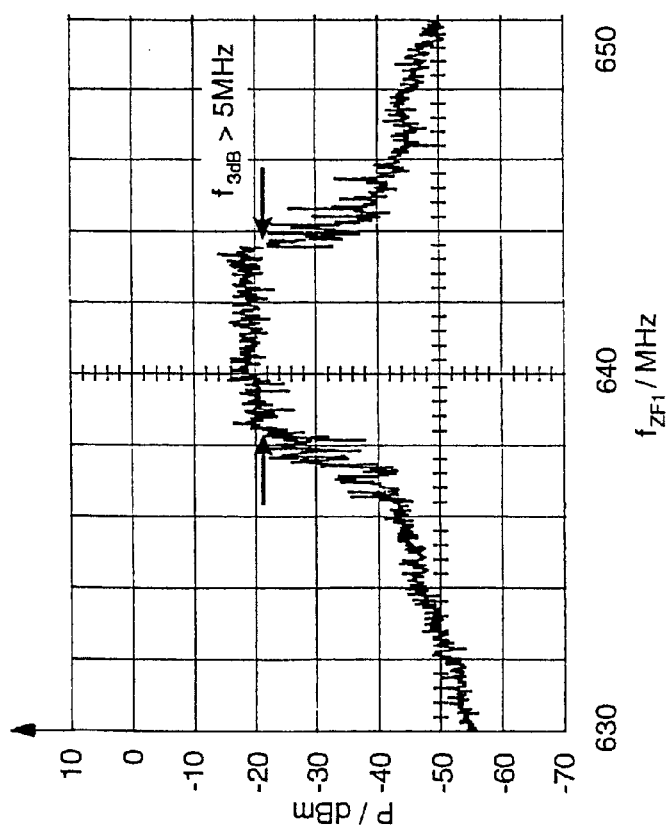
FIG. 2a shows the frequency spectrum of the independent backward wave oscillator.

FIGS. 2a and 2b demonstrate the effectiveness of the network analyzer according to the invention. They show the frequency spectrum of the millimeter wave output power of the backward wave tube at $f_s$=140 GHz converted to the first intermediate frequency of 640 MHz. The bandwidth of the 3 dB limit is at least 5 MHz in this unrestricted case but, with this phase-stabilized backward wave tube, the bandwidth becomes $f_3$=<100 Hz.

In FIG. 1, the frequency schedule is shown at the side of the block diagram. It shows the three-step uniform down-mixing from 70–175 GHz, by way of the intermediate frequencies $f_{zF1}$=640 MHz and $f_{ZF2}$=100 MHz, to $f_{ZF3}$=10 MHz in the transmitting as well as the receiving range. The numbers given in FIGS. 1 and 3, that is 5, 6, 7, 9 and 11 indicate the respective harmonics of the basic wave given by the microwave oscillator $O_2$, which are used in the respective upper wave mixer for the frequency conversion. A harmonic mixer can be operated on several harmonies; therefore, for the upward mixing of the complete D-band, only one mixer (n=7, 9 and 11) is used.

Figure 3:
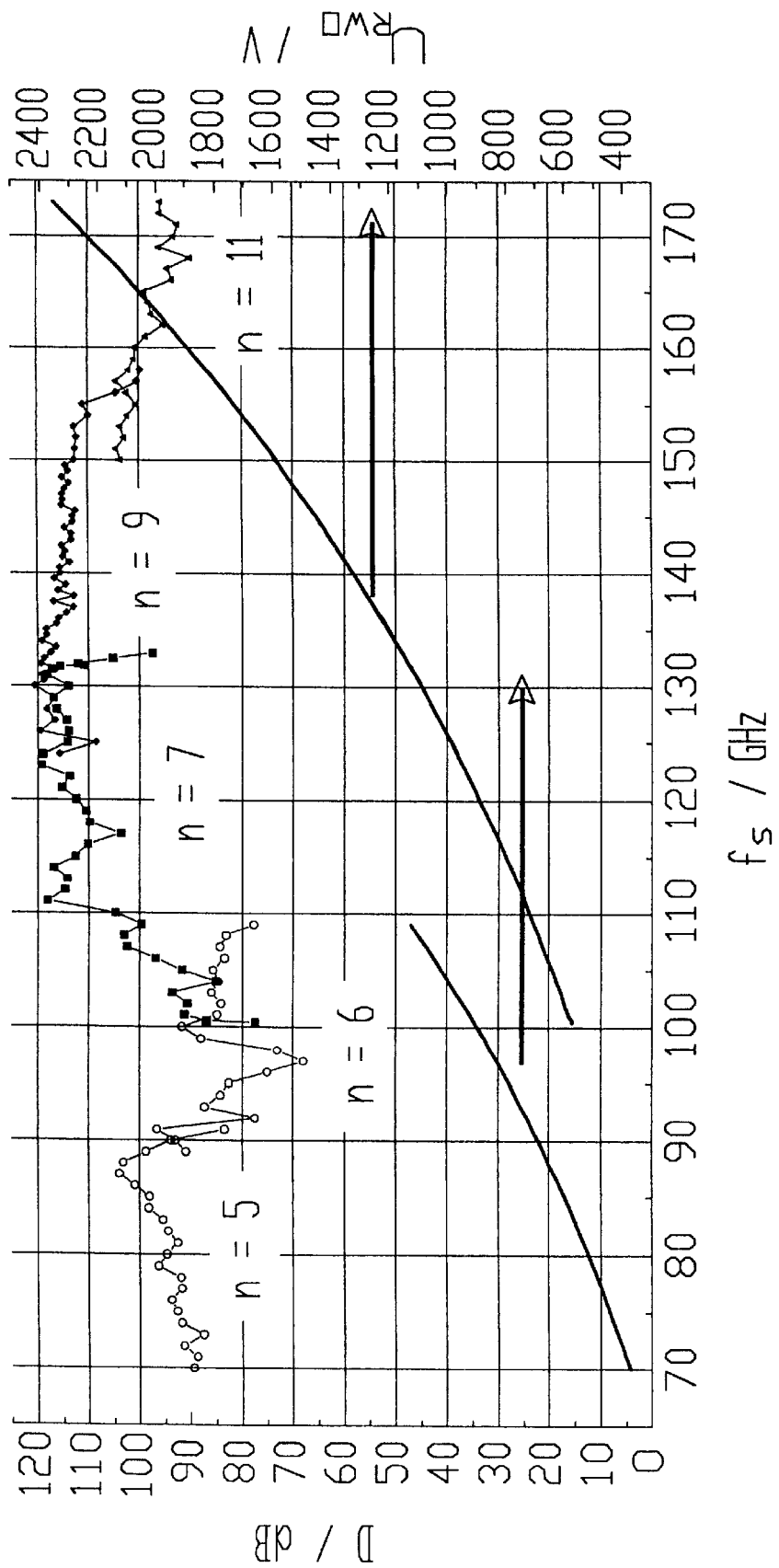
FIG. 3 shows for the measurement range D measured values in dB of the network channel analyzer.

FIG. 3 shows the measurement range D determined with the aid of a W-and D-band backward wave oscillator. A change of the BW oscillator and of the first mixer is unavoidable at a frequency of about 100 GHz because of the cut-off of the frequency by the dimensions of the respective hollow conductor.

The two lower curves each provided with an arrow pointing to the right indicate the acceleration voltage $U_{RWO}$ needed for the set transmission frequency $f_s$ and its plot with the backward wave oscillator used in each case.

What is claimed is:

1. A vector network analyzer for the microwave range of an output of a power supply having an output and an input comprising: a first millimeter wave oscillator in the form of a transit time tube with a transmitter arrangement, a millimeter wave receiver with a decoupling structure and a first device for the downward mixing of a received signal decoupled from an output of a power supply DUT (device under test) to be examined, a second device for the downward mixing of the part of the transmitted signal which was decoupled by said decoupling structure and directed to and input of the DUT, at least one additional microwave oscillator for the downward mixing of the transmitted and received signal, an additional reference oscillator with predetermined frequency which serves as a phase reference, a high frequency vector receiver serving as indicating device and equipment coupled thereto for the representation of the DUT disposed for examination between the transmitting and receiving devices, with a first power supply which has a controllable output voltage for the generation of the acceleration voltage for the first millimeter wave oscillator arranged in series with a controllable second power supply which is independent of the acceleration voltage, said second power supply having a control input which is independent of the acceleration voltage, a frequency discriminator connected to said control input and having an output connected to the control input of said second power supply and an input to which the reference signal of said reference oscillator is connected, and another input to which the output of said transmission side second device for the downward mixing is connected, said downwardly mixed transmission signal having the same frequency as the reference signal.

2. A vector network analyzer according to claim 1, wherein said reference oscillator times the millimeter wave oscillators and, consequently, forms the local oscillator for the transmitting and receiving side upward mixer.

3. A vector network analyzer according to claim 2, wherein said references oscillator is a quartz oscillator.

4. A vector network analyzer according to claim 3, wherein said transmitting and receiving side upward mixer for upward mixing to the frequency of the reference oscillator signal frequency includes a single stage (heterodyne) receiver.

5. A vector network analyzer according to claim 4, wherein the control input of the second power supply is connected to an output of a phase and frequency discriminator by way of an amplifier and a low pass filter.

6. A vector network analyzer according to claim 3, wherein the transmitting and receiving side upward mixer for upward mixing to the reference oscillator frequency includes each at least two stages (super heterodyne-receiver) and both stages mix upwardly in a different way.

7. A vector network analyzer according to claim 6, wherein an amplifier with high insulation (back attenuation) is provided and operates the first mixing stage of the two superheterodyne receivers and the isolation equals at least the amplification.

8. A vector network analyzer according to claim 7, wherein a first intermediate frequency amplifier in the receiving side upward mixer has so little noise that a noise figure $NF \leq 5$ dB is maintained.

9. A vector network analyzer according to claim 7, wherein the control input of the second power supply is connected to an output of a phase and frequency discriminator by way of an amplifier and a low pass filter.

10. A vector network analyzer according to claim 1, wherein said first millimeter wave oscillator is a backward wave oscillator (BWO).

* * * * *